(12) United States Patent
Das

(10) Patent No.: US 11,323,103 B2
(45) Date of Patent: May 3, 2022

(54) PEAK DETECTOR

(71) Applicant: Texas Instruments Incorporated, Dallas, TX (US)

(72) Inventor: Arnab Das, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/138,145

(22) Filed: Dec. 30, 2020

(65) Prior Publication Data
US 2022/0109435 A1 Apr. 7, 2022

(30) Foreign Application Priority Data
Oct. 1, 2020 (IN) .............................. 202041042752

(51) Int. Cl.
| H03K 5/00 | (2006.01) |
| G01R 19/00 | (2006.01) |
| G01R 19/04 | (2006.01) |
| H03K 5/01 | (2006.01) |
| H03K 5/1252 | (2006.01) |

(52) U.S. Cl.
CPC ............... *H03K 5/01* (2013.01); *G01R 19/04* (2013.01); *H03K 5/1252* (2013.01)

(58) Field of Classification Search
None
See application file for complete search history.

(56) References Cited

U.S. PATENT DOCUMENTS 6,975,170 B2 * 12/2005 Lin ..................... H03F 3/45659
330/255
8,497,711 B2 * 7/2013 Hsieh .................. H04L 25/0292
327/58

* cited by examiner

*Primary Examiner* — Kenneth B Wells
(74) *Attorney, Agent, or Firm* — Ebby Abraham; Charles A. Brill; Frank D. Cimino

(57) ABSTRACT

A circuit with a differential input configured to receive a differential analog input signal. The circuit also includes a common mode detection circuit, a primary signal circuit coupled, and a replica block. The circuit also includes a summer coupled to the output of the primary signal circuit and to an output of the replica block.

18 Claims, 3 Drawing Sheets

PEAK DETECTOR

CROSS-REFERENCE TO RELATED APPLICATION

This application claims the benefit of and priority to India patent Application No. 202041042752, filed Oct. 1, 2020, which is hereby fully incorporated herein by reference.

BACKGROUND

The example embodiments relate to electronic circuits and more particularly to a peak detector.

Peak detector circuits determine the maximum magnitude (peak) of an input signal connected to the peak detector, where the input is typically from another device in a signal chain. A peak detector may store the determined voltage peak value, for example across a capacitor, until the detector is reset. Peak detectors may be used in various instances, for example in spectral analysis, destructive testing, instrumentation measurement, and information transceivers. A peak detector circuit may internally generate both a DC and AC response to the input signal, but the AC signal is removed, for example by filtering, so that the DC response of the detector is the primary or sole output measure of the input signal. Accordingly, the peak detector essentially downconverts the input signal to a respective DC output signal representative of the input signal peak.

Because the output of a peak detector is a DC signal, the accuracy of that output may be compromised if affected by DC noise, such as flicker noise. Generally, flicker noise is a type of electronic noise in voltage or current that has a 1/frequency spectral density, so it increases at low frequencies. As a result, flicker noise occurring on the peak detector input signal can affect the accuracy of the peak detector output. One flicker noise mitigation technique uses higher area devices in the circuit block preceding the peak detector, that is, the block providing the signal to be peak-detected. Such an approach has limitations. For example, higher area devices increase cost and may create design considerations for other devices that may share a same substrate or the like. As another example, higher area devices may create larger capacitance, thereby reducing operational speed and limiting bandwidth. Accordingly, in some instances the design or operational requirements of the block preceding the peak detector may preclude the use of higher area devices. Another flicker noise approach includes both peak detecting and replica circuitry in the peak detector, and connecting a common mode voltage to the replica, whereby the common mode voltage is injected into the peak detection to reduce the noise in the peak detector output. For an AC coupled peak detector, the common node voltage may be generated as a voltage across a PN (diode) junction, for example as the gate-to-source voltage of a source-grounded field-effect-transistor, where the drain is driven by a current source. Or, for a DC coupled peak detector, the common node voltage may be generated as the source voltage minus a voltage drop across a resistor coupled between the source voltage and the drain of a field effect transistor that has a grounded source. These latter approaches, however, may not reduce flicker noise effect to a satisfactory level.

Example embodiments are provided in this document that may improve on various of the above considerations as well as other concepts, as further detailed below.

SUMMARY

In one embodiment, there is a circuit comprising a differential input configured to receive a differential analog input signal. The circuit also comprises a common mode detection circuit coupled to the differential input and having an output. The circuit also comprises a primary signal circuit coupled to the differential input. The circuit also comprises a replica block, including replicate circuitry of the primary signal circuit, coupled to the output of the common mode detection circuit. The circuit also comprises a summer coupled to the output of the primary signal circuit and to an output of the replica block.

In another embodiment, there is peak detector system comprising a differential input for receiving an analog differential input signal. The peak detector system also comprises a first differential circuit coupled to the differential input and for providing a DC peak signal having a magnitude responsive to a peak of the analog differential input signal. The peak detector system also comprises a common mode detection circuit for providing a common mode voltage relative to the differential input signal. The peak detector system also comprises a DC voltage circuit coupled to receive the common mode voltage and for providing a DC noise reduction signal. The peak detector system also comprises summing circuitry for offsetting the DC noise reduction signal from the DC peak signal.

In another embodiment, there is a method of operating a circuit. The method couples an analog differential input signal to a first differential circuit and couples a common mode signal from the analog differential input signal to a second differential circuit. The method further offsets an output of the first differential circuit with an output of the second differential circuit.

Other aspects are also disclosed and claimed.

DETAILED DESCRIPTION

Figure 1:
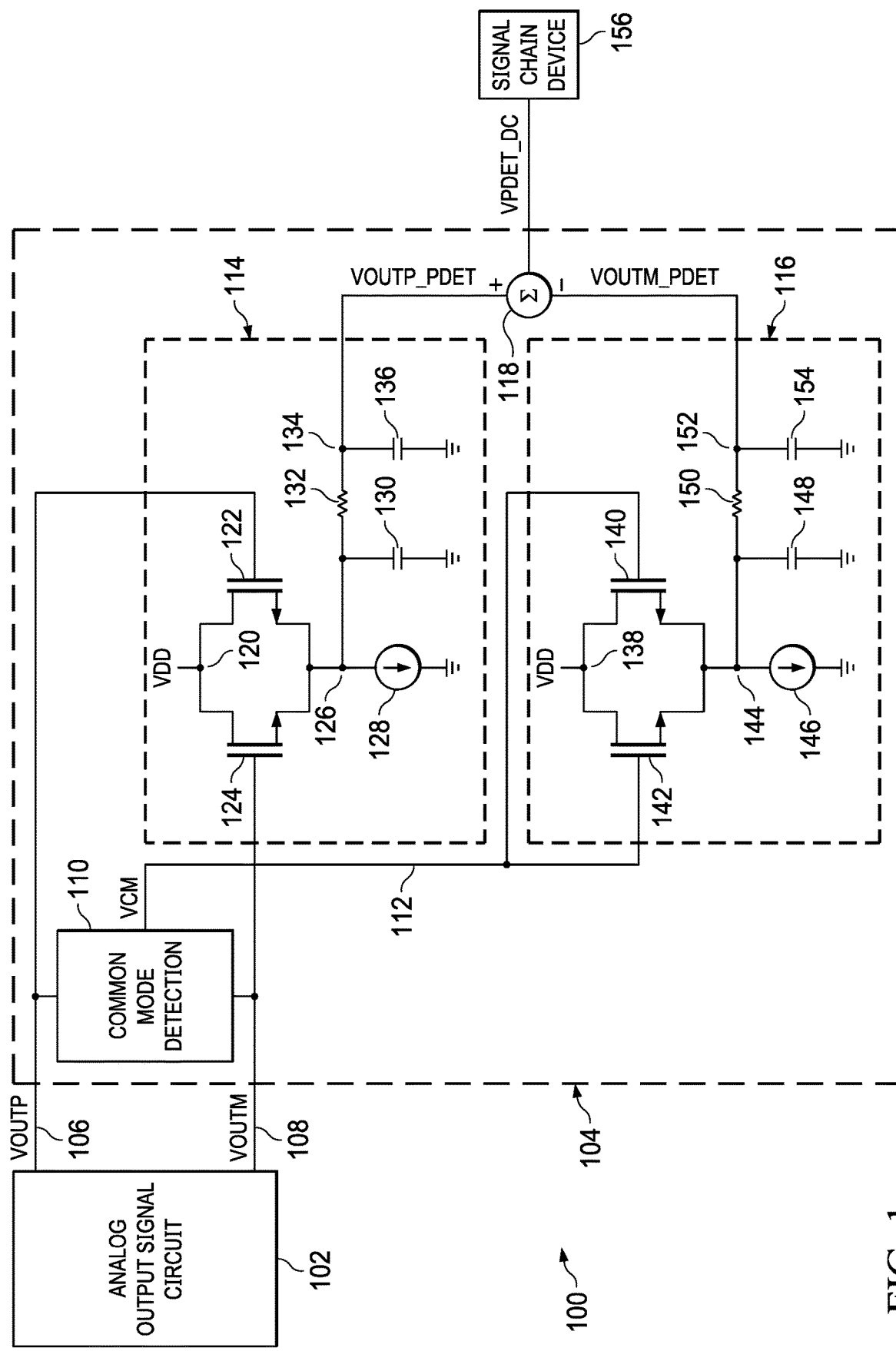
FIG. 1 illustrates an example embodiment peak detection system.

FIG. 1 illustrates an example embodiment peak detection system 100. The system 100 includes an analog output signal circuit 102 and a peak detector 104. The analog output signal circuit 102 represents any type of circuit that provides an analog output signal to be peak detected, with an example shown later in FIG. 3. In system 100, and by way of example, the analog output signal is a differential signal between VOUTP at a node 106 and VOUTM at a node 108. Accordingly, the nodes 106 and 108 provide a differential input to the peak detector 104.

Figure 2:
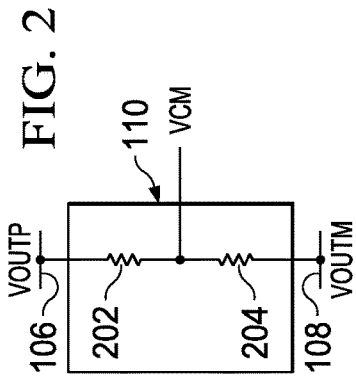
FIG. 2 illustrates one implementation of the FIG. 1 common mode detection circuit.

A common mode detection circuit 110 is coupled between the nodes 106 and 108, and it outputs a common node voltage VCM at a node 112. VCM is half the sum of the voltages VOUTP and VOUTM, and the internal circuitry of the common mode detection circuit 110 can be implemented to achieved that one-half result. For example, FIG. 2 illustrates one implementation of the common mode detection circuit 110, in which two equal resistance resistors 202 and 204 are connected in series between the nodes 106 and 108, and VCM is provided at a node 206 between the resistors 202 and 204. In any event, more precisely the common-mode voltage is one-half the vector sum of the voltages from each conductor of a balanced circuit. In connection with the example embodiment, when those conductors are common to a same circuit (or cable) then each node is apt to be equally affected by noise, including flicker noise. Accordingly, for the analog output signal circuit 102 in FIG. 1, the signals on both conductors tend to be equally affected by noise from the circuit (e.g., circuit 102) providing the signals. VCM will be representative of that extracted noise.

The peak detector 104 also includes a primary signal block 114 and a replica block 116, each of which has a same schematic, but each respectively receives two different inputs. The primary signal block 114 receives VOUTP and VOUTM from the analog output signal circuit 102 and, in response, provides an output voltage VOUTP_PDET. The replica block 116 receives VCM from the common mode detection block 110 and, in response, provides a DC voltage VOUTM_PDET. Particularly, VOUTP_PDET is connected to a non-inverting input of a signal summer 118, and VOUTM_PDET is connected to an inverting input of the signal summer 118. Accordingly, the signal summer 118 subtracts correlated flicker noise, represented by the DC voltage VOUTM_PDET, from VOUTP_PDET, with the resultant difference output as the DC voltage peak detector measure VPDET_DC. VPDET_DC may be connected to a next signal chain device 156, such as an analog to digital converters (ADC.). Each of the primary signal block 114 and the replica block 116 is further detailed below.

The primary signal block 114 includes a node 120 that is connected to a power source VDD. The node 120 is also connected to the drain of a first transistor 122 and to the drain of a second transistor 124, where the first and second transistors 122 and 124 are nominally identical transistors. The gate of the first transistor 122 is connected to VOUTP, and the gate of the second transistor 124 is connected to VOUTM. Both the source of the first transistor 122 and the source of the second transistor 124 are connected to a common source node 126. The common source node 126 is connected through a current source 128 to ground, through a capacitor 130 to ground, and through a resistor 132 to a node 134. The node 134 is connected through a capacitor 136 to ground, and the node 134 also provides VOUTP_PDET.

The replica block 116 includes a node 138 that is connected to the power source VDD. The node 138 is also connected to the drain of a third transistor 140 and to the drain of a fourth transistor 142, where the third and fourth transistors 140 and 142 are nominally identical transistors. Both the gate of the third transistor 140 and the gate of the fourth transistor 142 are connected to the node 112 and VCM. Both the source of the third transistor 140 and the source of the fourth transistor 142 are connected to a common source node 144. The common source node 144 is connected through a current source 146 to ground, through a capacitor 148 to ground, and through a resistor 150 to a node 152. The node 152 is connected through a capacitor 154 to ground, and the node 152 also provides VOUTM_PDET.

The operation of the system 100 is now described, first with respect to the primary signal block 114. The analog output signal circuit 102 operates and outputs a differential analog signal between VOUTP and VOUTM. The analog signals VOUTP and VOUTM will include AC components and some amount of common mode noise that may arise from either circuit or environmental factors, and the noise will include flicker noise. The AC and noise components are connected as part of VOUTP and VOUTM to the primary signal block 114 and, more particularly, to the respective gates of the first transistor 122 and the second transistor 124. The first and second transistors 122 and 124 form a differential pair as to the AC signal, and each also receives the same noise at its respective gate. The AC components are filtered out of the signal by a combination of one or more of the resistor 132 and the capacitors 130 and 136, with a maximum (peak) of the AC component stored across the capacitor 136. Further, the flicker noise at the common source node 126 will be the flicker gate voltage minus the gate-to-source voltage of both of the first and second transistors 122 and 124, where that gate-to-source voltage is controlled by the current source 128. Accordingly, the flicker noise voltage at the common source node 126, along with a DC voltage representative of the analog voltage different between the first and second transistors 122 and 124, is output as VOUTP_PDET to the non-inverting input of the summer 118.

The operation of the system 100 is now described with respect to the replica block 116. VCM, for example as one-half the sum of VOUTP and VOUTM, will cancel the AC components because those are differential signals, but will include some amount of flicker noise as the noise is neither correlated nor differential in VOUTP relative to VOUTM, so VCM will provide the summed noise at VOUTP and VOUTM, halved by common mode detection circuit 110. In the replica block 116, VCM is connected to the respective gates of the third transistor 140 and the fourth transistor 142. While VCM provides half of the summed noise voltage of VOUTP and VOUTM to each individual gate of the third and fourth transistors 140 and 142, the collective noise voltages as applied to both of those gates can be considered as VOUTP+VOUTM, that is, because (VOUTP+VOUTM)/2 is applied to both gates. Accordingly, the flicker noise voltage at the common source node 144 will be the collective flicker noise gate voltage of VOUTP+ VOUTM minus the gate-to-source voltage of both of the third and fourth transistors 142 and 144, where that gate-to-source voltage is controlled by the current source 146. In other words, in ideal conditions, the flicker noise at the common source node 144 in the replica block 116 will be the same as the flicker noise at the common source node 126 of the primary signal block 114. In any event, this resultant flicker noise voltage at the common source node 144 is output as VOUTM_PDET to the inverting input of the summer 118.

The system 100 thus provides both a peak-indicating DC and flicker noise component in VOUTP_PDET, and a flicker noise component in VOUTM_PDET, and both are inputs to the summer 118. Accordingly, because the flicker noise input to the replica block 116 is taken from the same analog output signal circuit 102 that generates the AC signal to be peak detected by the primary signal block 114, the flicker noise input to the primary signal block 114 for peak detection correlates with the noise input to the replica block 116 for noise detection. As a result, the differential operation of the summer 118 subtracts the correlated flicker noise signals from one another, effectively reducing or canceling the noise component of the DC voltage peak detector measure VPDET_DC. Accordingly, VPDET_DC represents a DC peak detection measure proportional to the largest analog differential signal between VOUTP and VOUTM from analog output signal circuit 102, with reduced effect on that measure by any flicker noise in that analog output signal.

Figure 3:
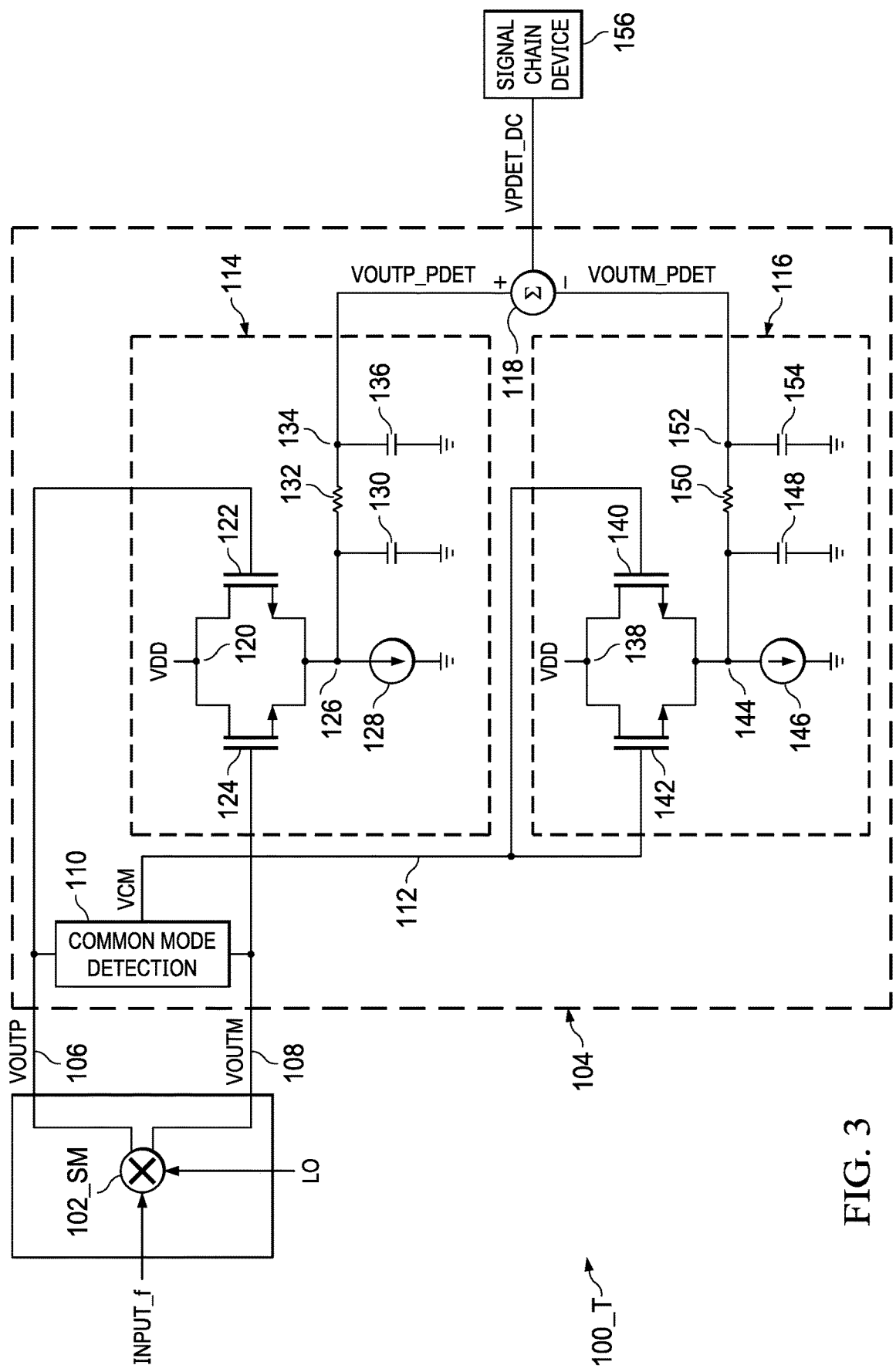
FIG. 3 illustrates a telecommunications system embodiment.

FIG. 3 illustrates a telecommunications system embodiment 100_T as an example implementation of the FIG. 1 system 100. The output signal circuit 102 is implemented as a signal mixer 102_SM, for example in a transceiver. The signal mixer 102_SM combines two different frequency signals, namely, an analog input signal INPUT_f with a local oscillator signal (LO). These input signals may be singled ended or differential. Further, by way of example, the signal mixer 102_SM may have relative high gain and bandwidth (e.g., 16 dB gain and 300 MHz bandwidth). The resultant output signal VOUTP may provide one or both of the sum and difference of the mixer input signals, and one of either the sum or difference may be removed by a filter (not shown). Accordingly, with VOUTP and VOUTM depending on the signal mixer 102_SM inputs and corresponding output, then VPDET_DC represents a DC peak detection measure proportional to the largest magnitude of the mixing (adding or subtracting) of INPUT_f and LO.

Figure 4:
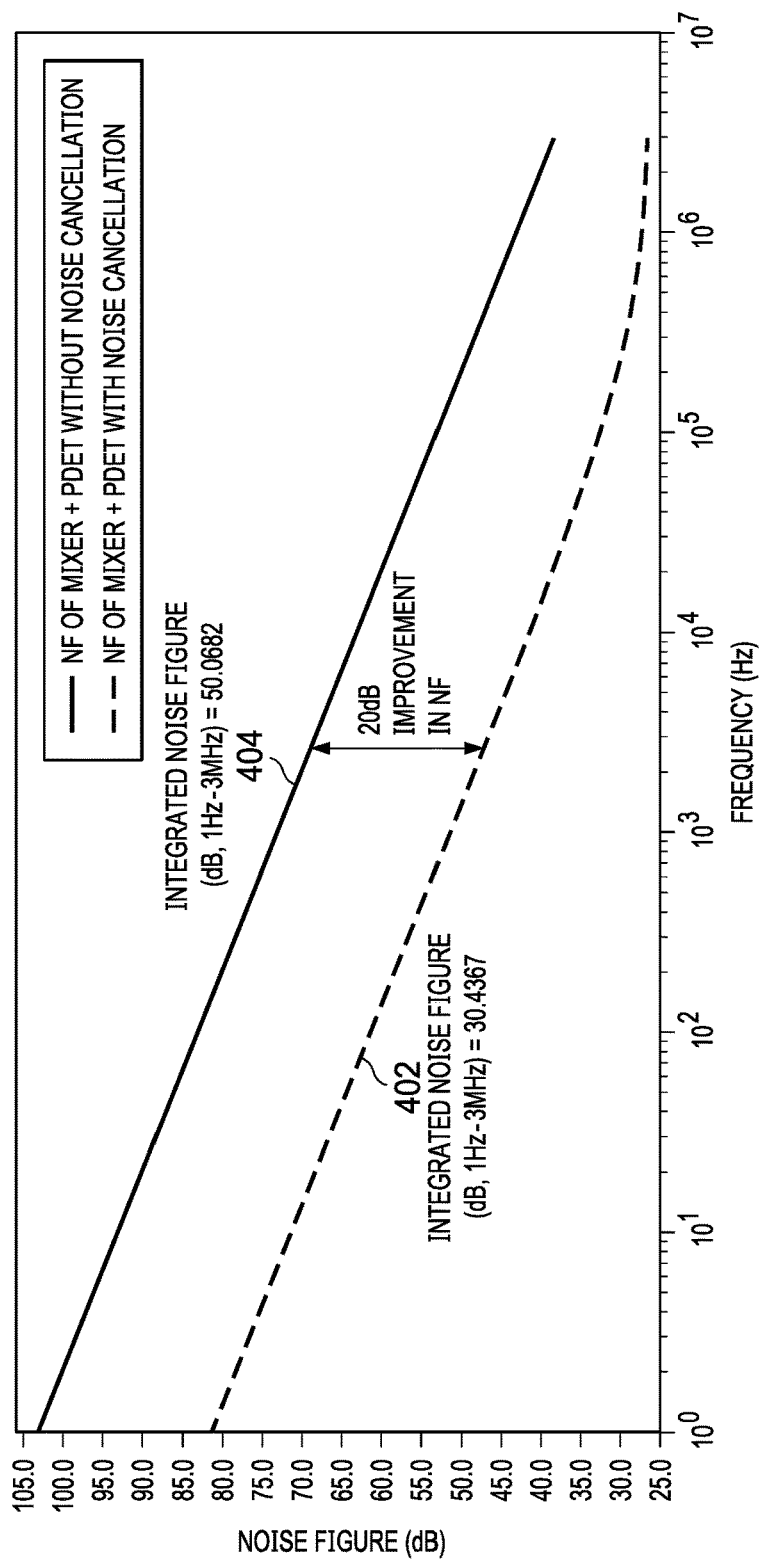
FIG. 4 illustrates a simulation diagram including the noise figure performance of the FIG. 3 system.

FIG. 4 illustrates a simulation diagram 400 of the noise figure performance of the FIG. 3 system 100_T, with frequency on the horizontal axis and noise figure on the vertical axis. The diagram 400 includes a plot 402 of the simulated noise performance of the FIG. 3 system 100_T across the range of illustrated frequency. The diagram 400 further includes a plot 404 of the simulated noise performance of the FIG. 3 system 100_T across the same range of illustrated frequency, but with the common mode detection 110 removed from the system. As shown, the plot 402 represents an approximate 20 dB performance increase as compared to the plot 404, across a wide range of frequency (e.g., 1 Hz to 1 MHz). Accordingly, the system 100_T provides a considerable performance increase, including in a high bandwidth implementation. Still further, the performance increase can likewise enhance performance and selection of additional devices in the system signal chain. For example, when an ADC follows the peak detector in the signal chain as shown in FIG. 1, where excessive flicker noise coupled to the ADC can degrade the ADC output precision or can complicate the ADC design or selection. In contrast, the example embodiment performance enhancement will reduce ADC error and/or facilitate lesser demands on the ADC design.

From the above, example embodiments include a peak detector with improved noise reduction performance. While the above-described attributes are shown and described, changes are also contemplated. For example, the analog output signal circuit coupled to the peak detector may be of various types, including the FIG. 3 illustrated signal mixer; as alternatives, however, the analog output signal circuit may be any of various other analog output devices, particularly when limited by size or requiring high bandwidth or high gain. Such devices may include a baseband amplifier or other signal chain devices, where a peak detector may reduce the bandwidth requirement for a signal chain, such as a blocker detection receiver or on-off keying based receiver. As another example, additional modifications are possible in the described embodiments, and other embodiments are possible, within the scope of the following claims.

What is claimed is:

1. A circuit comprising:
   a differential input configured to receive a differential analog input signal;
   a common mode detection circuit coupled to the differential input and having an output;
   a primary signal circuit coupled to the differential input and having a common source primary signal circuit output;
   a replica block, including replicate circuitry of the primary signal circuit, coupled to the output of the common mode detection circuit and having a common source replica block output; and
   a summer coupled to the common source primary signal circuit output through a first filter and to the common source replica block output through a second filter.

2. The circuit of claim 1 wherein each of the primary signal circuit and the replica block includes a differential transistor pair.

3. The circuit of claim 2:
   wherein a gate of a first transistor in the differential pair of the primary signal circuit is configured to receive a first signal in the differential analog input signal;
   wherein a gate of a second transistor in the differential pair of the primary signal circuit is configured to receive a second signal in the differential analog input signal; and
   wherein a gate of a first transistor in the differential transistor pair of the replica block and a gate of a second transistor in the differential transistor pair of the replica block is coupled to the output of the common node detection circuit.

4. The circuit of claim 3:
   wherein a common source node of a first transistor and a second transistor in the differential transistor pair of the primary signal circuit is coupled to a first current source; and
   wherein a common source node of a first transistor and a second transistor in the differential transistor pair of the replica block is coupled to a second current source.

5. The circuit of claim 3:
   wherein a common source node of a first transistor and a second transistor in the differential transistor pair of the primary signal circuit is the common source primary signal circuit output and is coupled to a first capacitor and a first terminal of a first resistor, wherein a second terminal of the first resistor is further coupled to a second capacitor, the first filter including the first capacitor, the first resistor, and the second capacitor; and
   wherein a common source node of a first transistor and a second transistor in the differential transistor pair of the replica block is the common source replica block output and is coupled to a third capacitor and a first terminal of a second resistor, wherein a second terminal of the second resistor is further coupled to a fourth capacitor, the second filter including the third capacitor, the second resistor, and the fourth capacitor.

6. The circuit of claim 1 wherein the common mode detection circuit includes:
   a first resistor having a first terminal coupled to a first input in the differential input; and
   a second resistor having a first terminal coupled to a second input in the differential input; and
   wherein the output of the common mode detection circuit is coupled to a second terminal of the first resistor and a second terminal of the second resistor.

7. The circuit of claim 1 and further comprising an analog output signal circuit for providing the differential analog input signal.

8. The circuit of claim 1 and further comprising a transceiver for providing the differential analog input signal.

9. The circuit of claim 1 and further comprising an analog-to-digital converter coupled to an output of the summer.

10. A peak detector system comprising:
    a differential input for receiving an analog differential input signal;

a first differential circuit coupled to the differential input and for providing a direct current (DC) peak signal having a magnitude responsive to a peak of the analog differential input signal;

a common mode detection circuit for providing a common mode voltage relative to the differential input signal;

a DC voltage circuit coupled to receive the common mode voltage and for providing a DC noise voltage; and circuitry for filtering the DC noise voltage to provide a filtered DC noise voltage and filtering the DC peak signal to provide a filtered DC peak signal; and circuitry for offsetting the filtered DC noise voltage from the filtered DC peak signal.

11. The peak detector system of claim 10 wherein the DC voltage circuit includes a replica of circuitry of the first differential circuit.

12. The peak detector system of claim 10 wherein each of the DC voltage circuit and the first differential circuit includes:

a first transistor;

a second transistor;

a common source node connected to a source of the first transistor and a source of the second transistor;

a current source coupled to the common source node; and a filter coupled to the common source node.

13. The peak detector system of claim 10 wherein the common mode detection circuit includes:

a first resistor having a first terminal coupled to a first input in the differential input; and a second resistor having a first terminal coupled to a second input in the differential input; and wherein a second terminal of the first resistor and a second terminal of the second resistor are for providing the common node voltage.

14. The peak detector system of claim 10 and further including a transceiver mixer for providing the analog differential input signal.

15. The peak detector system of claim 10 further including an analog to digital converter for receiving the DC peak signal.

16. A method of operating a circuit comprising:

coupling an analog differential input signal to a first differential circuit;

coupling a common mode signal from the analog differential input signal to a second differential circuit;

filtering an output of a common source node of the first differential circuit and an output of a common source node of the second differential circuit; and offsetting the filtered output of the first differential circuit with the filtered output of the second differential circuit.

17. The method of claim 16 wherein the second differential circuit includes a replica of circuitry of the first differential circuit.

18. The method of claim 16 wherein the offsetting step includes subtracting a signal from the filtered output of the second differential circuit from a signal from the filtered output of the first differential circuit.

* * * * *